(12) United States Patent
Van De Ven et al.

(10) Patent No.: US 7,992,295 B2
(45) Date of Patent: Aug. 9, 2011

(54) METHOD FOR INTERCONNECTING TRACKS PRESENT ON OPPOSITE SIDES OF A SUBSTRATE

(75) Inventors: Augustinus Cornelis Maria Van De Ven, Westerhoven (NL); Rik Franciscus Jozef Peter Rozeboom, Heerlen (NL)

(73) Assignee: Meco Equipment Engineers B.V., Drunen (NL)

( * ) Notice: Subject to any disclaimer, the term of this patent is extended or adjusted under 35 U.S.C. 154(b) by 316 days.

(21) Appl. No.: 12/095,124

(22) PCT Filed: Dec. 5, 2006

(86) PCT No.: PCT/NL2006/000615
§ 371 (c)(1),
(2), (4) Date: May 28, 2008

(87) PCT Pub. No.: WO2007/069886
PCT Pub. Date: Jun. 21, 2007

(65) Prior Publication Data
US 2008/0301936 A1      Dec. 11, 2008

(30) Foreign Application Priority Data
Dec. 13, 2005    (NL) .................................... 1030664

(51) Int. Cl.
*H01K 3/10*       (2006.01)
(52) U.S. Cl. ................ 29/852; 29/830; 29/831; 29/846; 29/825

(58) Field of Classification Search ............ 29/830–834, 29/846–852, 600, 602.1; 174/255–264
See application file for complete search history.

(56) References Cited

U.S. PATENT DOCUMENTS

| | | | | |
|---|---|---|---|---|
| 5,218,761 A * | 6/1993 | Maniwa et al. | ................ | 29/852 |
| 5,758,412 A * | 6/1998 | Knopp | .............. | 29/852 |
| 6,035,527 A * | 3/2000 | Tamm | .............. | 29/852 |
| 6,161,276 A * | 12/2000 | Droz | ............ | 29/602.1 |
| 6,176,010 B1 * | 1/2001 | Droz | .............. | 29/832 |
| 6,308,406 B1 * | 10/2001 | Gill et al. | ......... | 29/849 |
| 7,047,624 B2 * | 5/2006 | Vogt | ................ | 29/600 |

FOREIGN PATENT DOCUMENTS

| | | |
|---|---|---|
| EP | 1 477 927 | 11/2004 |
| WO | 03 043394 | 5/2003 |

\* cited by examiner

*Primary Examiner* — Minh Trinh
(74) *Attorney, Agent, or Firm* — Oblon, Spivak, McClelland, Maier & Neustadt, L.L.P.

(57) ABSTRACT

A method and device for making an electrically conductive connection between two electrically conductive tracks present on two opposite sides of a dielectric substrate. The method: a) provides the substrate, with at least one first electrically conductive track present on one side thereof and at least one second electrically conductive track present on the other side of the substrate opposite the one side, b) forms a through hole through the substrate and through two opposite parts of a first track and a second track, respectively, and c) makes an electrically conductive connection via the through hole between the first track through which the through hole has been formed and the second hole through which the through hole has been formed.

23 Claims, 7 Drawing Sheets

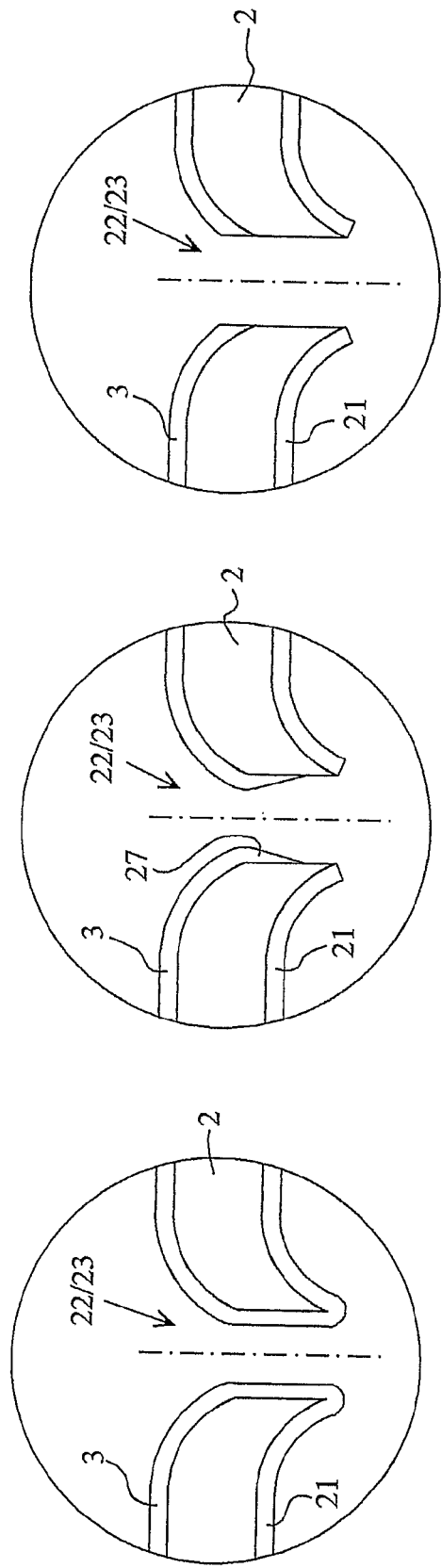
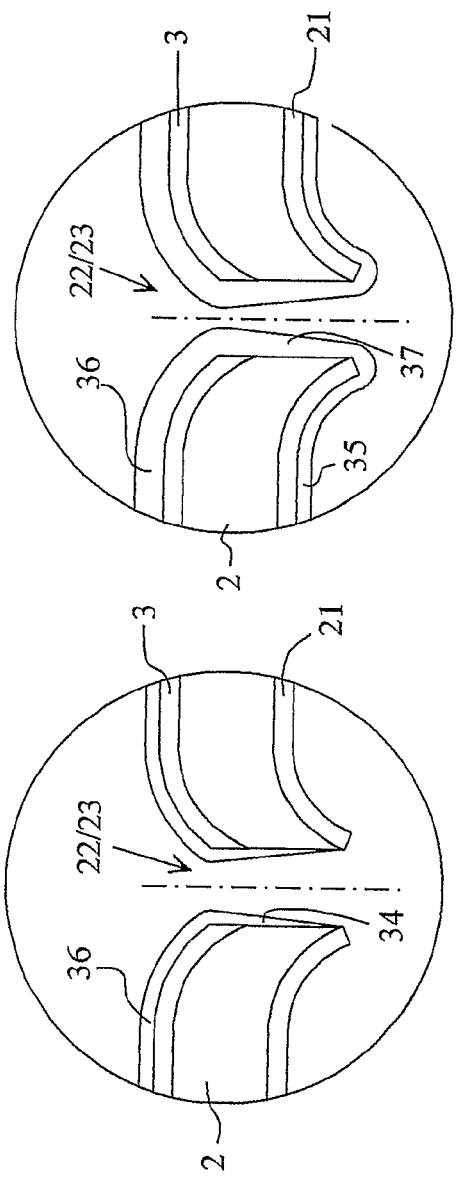

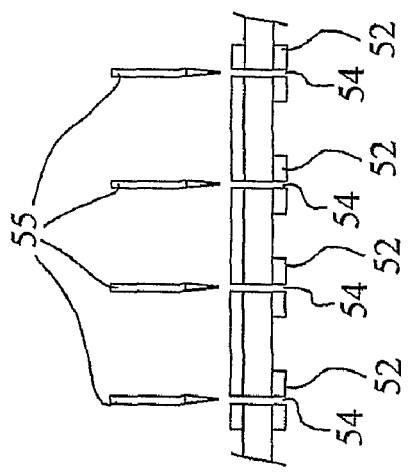
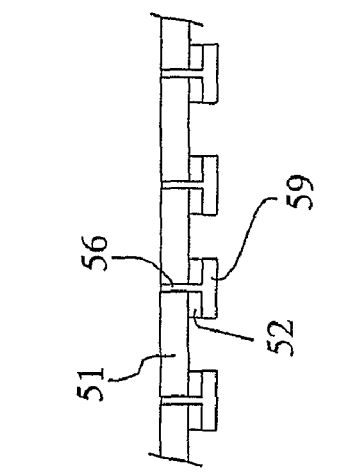
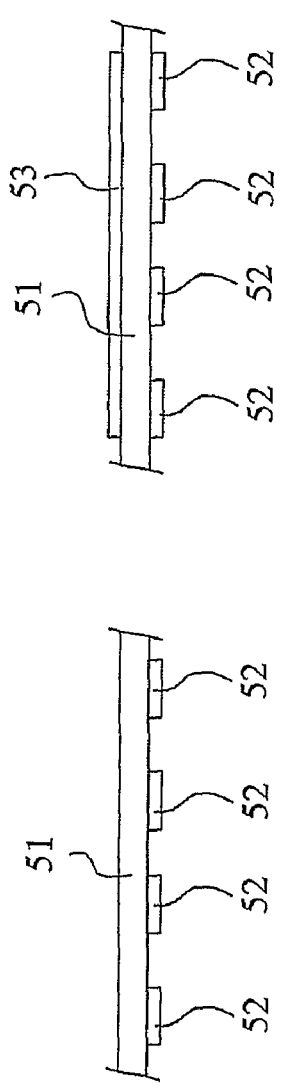
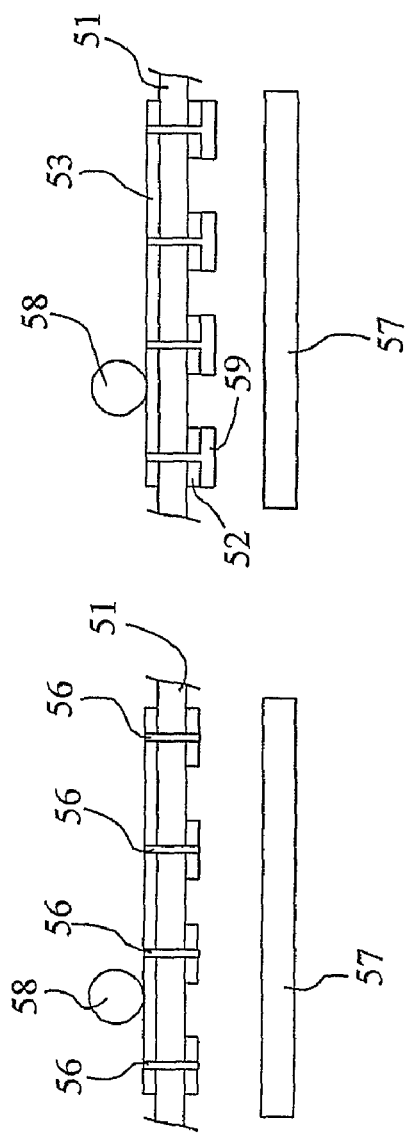

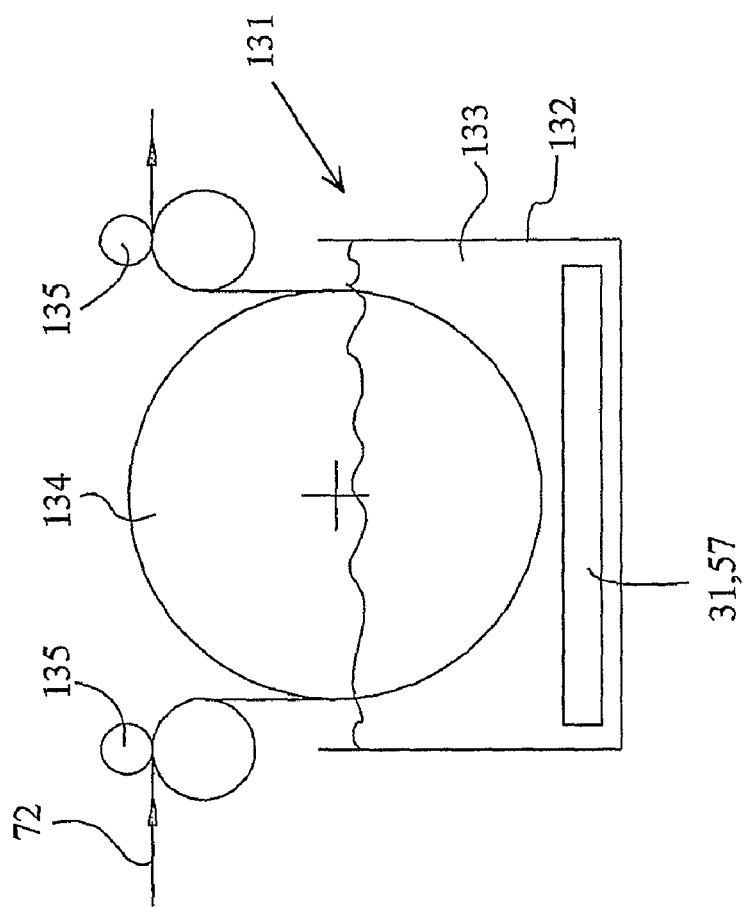
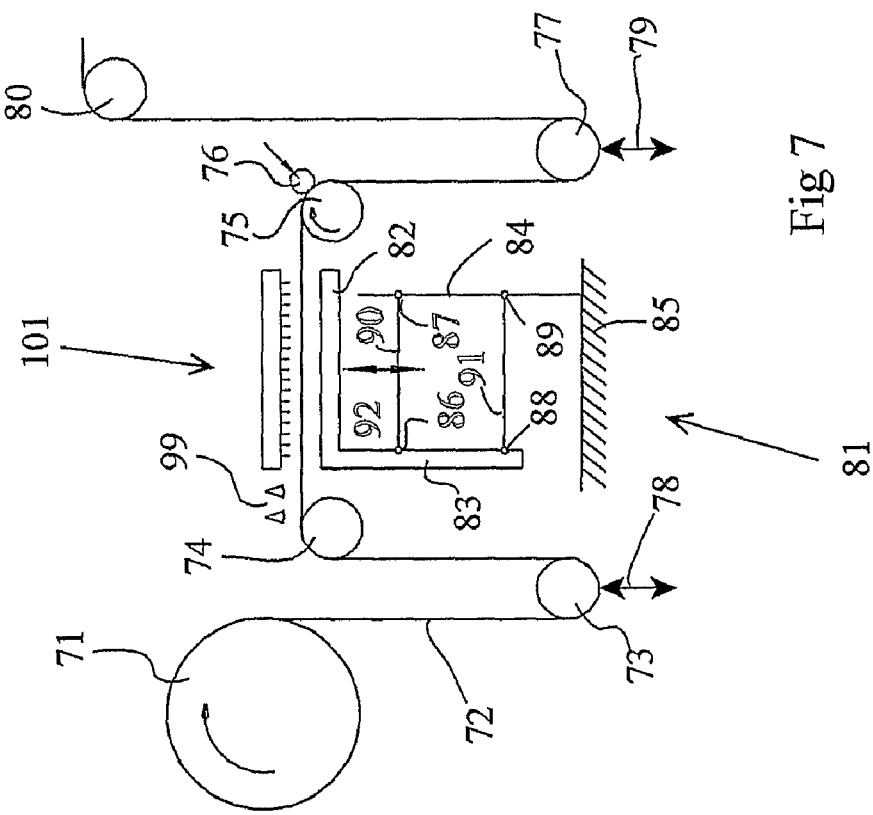
Fig 8
Fig 7

METHOD FOR INTERCONNECTING TRACKS PRESENT ON OPPOSITE SIDES OF A SUBSTRATE

The present invention relates to a method for making an electrically conductive connection between two electrically conductive tracks present on two opposite sides of a dielectric substrate. The field of applications to be considered within the framework of the present invention is in particular, but not exclusively, RFIDs, which require an electrical connection for connecting ends of a coil antenna to an IC. Besides the field of RFIDs, the present invention may also be implemented in the production of other types of electronic components, such as flexible electronic circuits, flexible cable harnesses, electro-fluorescent displays and flexible solar panels, and furthermore in particular in those cases in which the tracks in question have comparatively small main dimensions, so that it is not possible, or at least only with significant drawbacks, to realise electrolytic growth of the tracks using prior art methods.

In the case of RFIDs it is known to form a bridge of a dielectric material over the coils of the coil antenna. An electrically conductive bridge connection is provided on the side of the dielectric bridge remote from the coils in that case, which interconnects the ends of the coil antenna via the IC. The drawback of such a method for manufacturing an RFID is the number of processing steps to be carried out separately and the manipulation of the substrate that is necessary, so that this known method is not very suitable for mass production. In addition it has become apparent in practice, partially because the electrically conductive bridge connection must bridge a difference in height, that the electrically conductive bridge connection frequently exhibits fractures.

From US patent application US 2005/0078035 A1 it is furthermore known (see in particular FIGS. 7A-8D and the associated description of said figures) to use a flexible substrate with a conductive ink layer patterned in the form of a coil antenna present on one side thereof. Holes are punched through the substrate from the other side, in such a manner that said holes extend through ends of the coil pattern. The holes are subsequently sealed by means of a conductive foil on the side remote from the coil pattern. In the situation in which the substrate is so oriented that the foil is present at the bottom side thereof, the holes are filled with a conductive ink. Thus, the pattern ends are electrically conductively interconnected via the ink in the holes and the foil at the bottom side of the substrate. This method is not very suitable for mass production, either. The reason for this is in part the fact that the conductive ink with which the holes are filled is comparatively expensive, whilst in addition this ink cannot be easily introduced into the holes by means of the same technology that is used for forming an electrically conductive track, such as an antenna pattern for an RFID, on a substrate. Moreover, filling the holes with conductive ink requires a high degree of precision from the equipment used for carrying out this operation, because of the necessary alignment with the holes to be filled.

Internationale patent application WO 03/043394 A1 describes how a cut is made in a substrate at an angle of 45 degrees. The cutting tool is provided with a driver hook, which positions the original bottom side of the substrate, at the location of part of the cut, on the upper side of the substrate at the location of part of the cut when the cutting tool is being retracted. In this way parts of electrically conductive tracks on two opposite sides of the substrate are brought into direct contact with each other. A drawback of this technique is that the connection between the tracks on the two opposite sides of the substrate that is realised in this manner is unreliable. In addition, the cut takes up a comparatively great deal of space on the substrate.

It is an object of the present invention to provide a method as referred to in the introductory paragraph which, partly because of the comparatively low cost involved, is in particular suitable for mass production. More specifically it is an object of the invention to provide a method by means of which a connection can be made between two electrically conductive tracks present on two opposite sides of a (flexible) substrate in a very efficient and reliable manner, which method does not have the drawbacks of prior art methods as described above, or which at least offers an improvement/solution in that regard. In order to accomplish that object, the method according to the invention comprises the steps of a    providing the substrate, with at least one first electrically conductive track present on one side thereof and at least one second electrically conductive track present on the other side of the substrate opposite said one side, b    forming a through hole through the substrate and through two opposite parts of a first track and a second track, respectively, c    making an electrically conductive connection via said through hole between the first track through which the through hole has been formed and the second hole through which the through hole has been formed.

By starting from a substrate that is provided with respective electrically conductive tracks on two opposite sides thereof and forming a hole therethrough, via which hole an electrical connection is made between the two tracks, an electrically conductive connection can be realised in a very efficient and reliable manner between two electrically conductive tracks present on either side of a substrate as may be necessary or at least desirable for a large number applications, for example in the case of RFIDs.

It is noted in passing that the term "electrically conductive track" as used within the framework of the invention is to be given a broad interpretation, in the sense that it is understood to include a full laminate layer, for example of copper. For the sake of completeness it is furthermore noted that within the framework of the invention the first track and/or the second track need not necessarily lie on a free surface of a substrate and/or that said tracks must originally have belonged to one and the same substrate. Thus, the substrate with the first electrically conductive track and the second electrically conductive back may also form part of a sandwich-like electronic component, which comprises a number of substrates with electrically conductive tracks present therebetween and possibly on one or both outer sides thereof. Originally, only one side of said substrates may be provided with an electrically conductive track, whilst stacking of such substrates creates a situation in which at least one intermediate substrate is in fact provided with an electrically conductive track on two opposite sides thereof.

Preferably, the through hole is formed by piercing, using a piercing tool. The advantage of piercing over a punching or cutting technique, for example, without wishing to exclude the use of these production techniques categorically within the framework of the present invention, is that because of said piercing, which is not a material-removing operation, the material of the electrically conductive track is smeared out in the hole to a certain extent at the location where the piercing starts. As a result, at least part of the inner side of the through hole is already lined with electrically conductive material from the respective electrically conductive track because of said piercing operation.

Such smearing out may even occur to such an extent that the electrically conductive connection between the first track and the second track via the through hole is already realised by the very piercing operation.

Accordingly, a special preferred embodiment of the present invention is characterised in that the electrically conductive connection is obtained by the piercing of the through hole. Factors that play a role in this regard are in any case the thickness of the substrate and the thickness of the electrically conductive tracks. In addition to that, the dimensions and the roughness of the piercing tool play a role, as does the material and the roughness of the surface thereof.

In another greatly preferred embodiment, the method according to the invention comprises the step of causing an electrically conductive material to grow electrolytically from a first track, via the through hole, to a second track in an electrolytic bath to accomplish step c. An important advantage of this preferred embodiment is the possibility to realise the electrically conductive connection between the first track and the second track via the through hole by electrolytic means and subsequently and/or simultaneously increase the thickness of at least the second track and, if desired, the first track by electrolytic means in one in the same processing step, using the electrically conductive connection between the first track and the second track that has thus been effected by electrolytic means.

When realising the electrically conductive connection via the through hole by electrolytic means it is furthermore preferable if an anode is provided on the side of the substrate remote from the first track and the first track is brought into electrical contact with a cathode. This achieves that field lines between the anode and the cathode will extend via the through hole, so that the positive ions in the bath will tend to migrate to the first track via the through hole along the field lines, as a result of which an increased deposition of the respective ions in the through hole can be effected and the electrically conductive connection can thus be realised at an accelerated rate.

In another preferred embodiment, a further anode is provided on the side of the substrate on which the first track is present. In this way the electrolytic growth of the thickness of the first track can already take place simultaneously with the making of the electrically conductive connection between the first track and the second track via the through hole. A good example of a useful implementation of such a method is the mass production of RFIDs, where the first track forms the coil antenna. The second track is in that case intended to make the connection between the coil ends.

Alternatively it may be very advantageous for other applications if an anode is provided only on the side of the dielectric substrate remote from the first track. This is the case especially if the eventual functionality of the product in question that is produced by means of the method according to the invention is in particular related to the thickness of the second track, and the thickness of the first track is not relevant to the functionality of the products in question.

Such a situation may in any case occur if, in accordance with another preferred embodiment, the method according to the invention comprises the step of electrolytically increasing the thickness of the second track during step d, which step is to be carried out after step c. Within that context, the first track in any case functions to provide an electrically conductive connection from the cathode to the second track so as to enable the second track to attract metallic ions in the electrolytic bath.

In case the first track in principle only has the latter function, it may be preferable if the method comprises the step of removing the first track at least partially from the substrate, which step is to be carried out after step d. In the situation in which a number of second tracks are provided, which are connected to the same first track via several through holes in the substrate, said second tracks are thus electrically isolated from each other by removing the first track from the substrate. In this way relatively small patterns, for example having main dimensions in the order of maximally 25 mm, such as antennas for small RFIDs, which start from the second tracks and which, according to the prior art cannot (easily) grow electrolytically, can nevertheless be realised through electrolysis.

If an electrolytic bath is used, it is preferable if the cathode makes contact with the first track in the electrolytic bath. In this way the contact takes place as close to the location where precipitation of ions is desirable as possible in comparison with the situation in which the cathode is disposed outside the electrolytic bath.

To enable mass production in a continuous process, without the cathode having to drag over a track and possibly damaging the track, it is preferable if the cathode rolls over the first track. An important additional advantage is that thus there is no question of a fixed point of contact on the one track, so that electrolytic growth of the thickness of said track is in principle possible along the entire length thereof.

To enable a continuous production process, it is generally preferable when using an electrolytic bath to move the substrate through the electrolytic bath during step c.

Within the framework of the three preferred embodiments as described in the foregoing, reference is made to US patent application US 2005/0189226 A1, which describes a method and a device by means of which it is possible, similarly to the above-described embodiments, to have the cathode make contact with an electrically conductive track while rolling over said track in the electrolytic bath while the substrate is being moved through the electrolytic bath. This US application only describes the way in which the thickness of an electrically conductive track present on one side of a flexible substrate can be increased by electrolytic means, wherein both the cathode and the anode are present on the side of the electrically conductive track in question. The content of said US patent application is to be considered to be incorporated herein by this specific reference.

Furthermore preferably, the method according to the invention comprises the steps of unwinding the substrate from a roll for the purpose of carrying out step a, conveying the unwound part of the substrate through an electrolytic bath for the purpose of carrying out step c and forming the through hole in the substrate at a position between the roll and the electrolytic bath for the purpose of carrying out step b. Thus the (mass) production process can be carried out even more efficiently because the through holes are formed in the substrate directly before the substrate is transported through an electrolytic bath.

With regard to the forming of the through holes it is preferable if the method comprises the step of locally interrupting the transport of the unwound part of the substrate temporarily while the through hole is being formed in the substrate. This implies that the part of the substrate in which the through holes are to be formed is stationary during the formation of said through holes, whilst the downstream part of the substrate that is present in the electrolytic bath continues to be transported through the electrolytic bath without interruption, so that the electrolytic process will proceed as uniformly as possible.

In particular for the purpose of producing a substrate with comparatively small, mutually isolated patterns of an electrically conductive material present on one side thereof, it is preferable if the method comprises the steps of providing the substrate with at least two second electrically conductive tracks, which are electrically isolated from each other, for the purpose of carrying out step a, forming two through holes in the substrate through two opposite parts of one and the same first track on the one hand and of the two second tracks, respectively, on the other hand for the purpose of carrying out step b, and realising two electrically conductive connections, via the two through holes, between the first track, through which the two through holes have been formed, on the one hand and the two second tracks, through which the respective two through holes have been formed, on the other hand for the purpose of carrying out step c. The formation of the small electrically conductive patterns in that case starts from the second tracks, whose thickness is electrolytically increased. The small patterns in question can be isolated from each other in that, in accordance with a preceding preferred embodiment, the first track is at least partially removed from the substrate, for example by etching or scratching, after the thickness of the second tracks has been increased by means of an electrolytic process.

More specifically, the aforesaid preferred embodiment is advantageous if the main dimensions of the second tracks are smaller than 35 mm or, furthermore preferably, smaller than 25 mm. If the main dimensions are smaller than 25 mm, it is virtually impossible to increase the layer thickness of the tracks by means of conventional electrolysis, whilst the advantages of the present preferred embodiment are also obtained when using main dimensions of maximally 35 mm.

More specifically for use with RFIDs it is advantageous if the method according to the invention comprises the steps of forming a number of through holes in the substrate through two opposite parts of one and the same first track and of one and the same second track, respectively, for the purpose of carrying out step b, and making electrically conductive connections, via the two through holes, between the first track, through which the two through holes have been formed, and the second track, through which the through holes have been formed, for the purpose of carrying out step c. Preferably, the parts in question are located at the ends of the respective tracks.

The through hole is preferably oriented perpendicularly to the plane of the substrate. On the one hand, the through hole can thus have a minimum length. On the other hand, this provides the advantage that no lateral forces act on the substrate, or at least need not act thereon, during the forming of the through hole.

The electrically conductive connection preferably extends along the wall of the through hole. The wall in question may in that case very suitably act as an element for the material of the electrically conductive connection something to hold on to, so that a highly reliable electrically conductive connection can be effected and in principle there need not be any deformation of the material of the substrate at the location of the through hole.

The through hole furthermore preferably extends within the circumference of the first track and/or the second track. This makes it possible to fully utilise the boundary edges between the through hole on the one hand and the first track and/or the second track on the other hand for realising the electrically conductive connection via said boundary edges. In this way the contact between the electrically conductive connection on the one hand an the first track and/or the second track on the other hand can be effected along the entire length of the circumferential boundary lines between the through hole on the one hand and/or the second track on the other hand. In addition, no space is used at the outer side of the first track and/or the second track on the substrate for realising the electrically conductive connection.

Preferably, the proportion between the diameter of the through hole, measured in two different directions perpendicular to the central axis of the through hole, is maximally 2. Square holes, for example, would fall within this range, but cuts as for example described in WO 03/043394 A1 would not.

Preferably, the through hole has a circular cross-section. On account of the absence of acute transitions this will have an advantageous effect as regards the reliability of the electrically conductive connection, whilst in addition comparatively simple tools having a circular cross-section may be used for forming the through hole.

In particular within this framework it is preferable if the through hole is formed by means of a pin-shaped element, for example a needle or a punch.

The invention further relates to a device for use in the method according to the invention as explained in the foregoing, said device comprising hole forming means for forming through holes through a dielectric substrate and through electrically conductive tracks present on two opposite sides thereof, said hole forming means comprising support means for supporting the substrate while said through holes are being formed therein, a frame provided with a number of hole forming means, and moving means for moving the frame and/or the support means relative to each other whilst the substrate is present between the frame and the support means. Using a device thus configured, through holes can be formed in the dielectric substrate with a high degree of precision, so that it is ensured that said through holes will also extend through the electrically conductive tracks present on the two opposite sides of the substrate.

To increase productivity, the device preferably comprises conveying means for conveying the substrate between the frame and the support means.

Preferably, the invention furthermore comprises control means for controlling the device in such a manner that the conveying means will not be operative during operation of the moving means. In this way it is ensured that the substrate will remain stationary during the time the through holes are being formed.

The hole forming means are preferably provided in a number of parallel rows in the frame, so that through holes can be formed simultaneously in a number of parallel rows of electrically conductive tracks present on the substrate.

To adapt the device for handling substrates with different electrically conductive tracks present thereon, it is furthermore advantageous if the hole forming means comprise a number of sliding shafts connected to the frame, along which a number of hole forming means can be moved, as well as fixing means for detachably fixing the hole forming means to a respective sliding shaft at desired longitudinal positions.

For the same reason it is preferable if the hole forming means comprise adjusting means for adjusting the distance by which the parallel rows are spaced apart.

In order to further increase the precision with which the through holes are formed and to reduce the human factor in this regard, it is preferable if sensor means are provided for detecting a track on the substrate and adapting the position of the frame relative to the substrate in dependence on said detection prior to the operation of the moving means. In this way the positions at which the through holes are formed in the substrate are geared to the actual position of the electrically conductive tracks.

Quite preferably, the hole forming means comprise a pin-shaped element, preferably a needle, which extends through the substrate as well as through tracks present on two opposite sides of the substrate during operation of the moving means. As already explained before, track material is smeared out in the through hole when a needle is used, as a result of which the electrically conductive connection between the first track and the second track is obtained more quickly.

With the present invention it is very important that the hole that is formed on the substrate and the first and the second track be a through hole. For that reason the support means are preferably provided with a resilient layer on the side that faces towards the substrate, so that the hole forming means can extend into said resilient layer and it can be ensured that the hole will indeed be a through hole.

The moving means preferably comprise a four-rod mechanism, so that it will not be necessary to use guides, which guides would have to be very precise.

According to another aspect of the present invention, the invention relates to a device for use with a method according to the invention as explained in the foregoing, said device comprising an electrolytic bath, conveying means for conveying a dielectric substrate with at least one first electrically conductive track present on one side thereof and at least one second electrically conductive track present on the other side of the substrate opposite said one side through said electrolytic bath, wherein a through hole has been formed through the substrate and through two opposite parts of a first track and a second track, respectively, a cathode for realising electrically conductive contact with the first track and an anode disposed in the electrolytic bath on the side of the substrate remote from the first track.

It is furthermore preferable in that connection if the cathode is disposed in the electrolytic bath for the purpose of making contact with the first track in said electrolytic bath.

Furthermore preferably, the cathode rolls over the substrate while the substrate is being conveyed through the electrolytic bath.

The advantages of the use of such a device according to the latter aspect of the invention have already been explained in the foregoing with reference to the method according to the invention. Such a device might for example be configured in the manner described in the aforesaid US patent application US 2005/0189226 A1, with this understanding that one anode or a number of anodes are provided in the electrolytic bath only on the inner side or also on the outer side of the dielectric foil substrate 4 described therein.

Finally, the invention relates to a substrate with an electrically conductive track on either side thereof, which tracks have been electrically interconnected via a through hole in the substrate by means of a method according to the invention as described above.

The invention will not be explained in more detail by means of a description of a preferred embodiment thereof, in which reference is made to the following figures.

FIGS. 4a-4c are three cross-sectional views of areas surrounding through holes that have been pierced in a substrate with electrically conductive tracks present on either side thereof;

FIGS. 5a and 5b are cross-sectional views of two successive situations during the forming by electrolytic means of an electrically conductive connection via the through hole, starting from the situation that is shown in FIG. 4c;

FIGS. 6a-6f are schematic, cross-sectional views of six successive situations during the execution of another preferred embodiment of the method according to the invention;

FIG. 7 is a schematic side view of a device for forming through holes in a web of substrate material;

FIG. 8 is a schematic side view of an electrolytic bath for making an electric connection between the electrically conductive tracks present on either side of substrate material via a through hole which has (for example) been formed by means of a device as shown in FIG. 7;

Figure 1A:
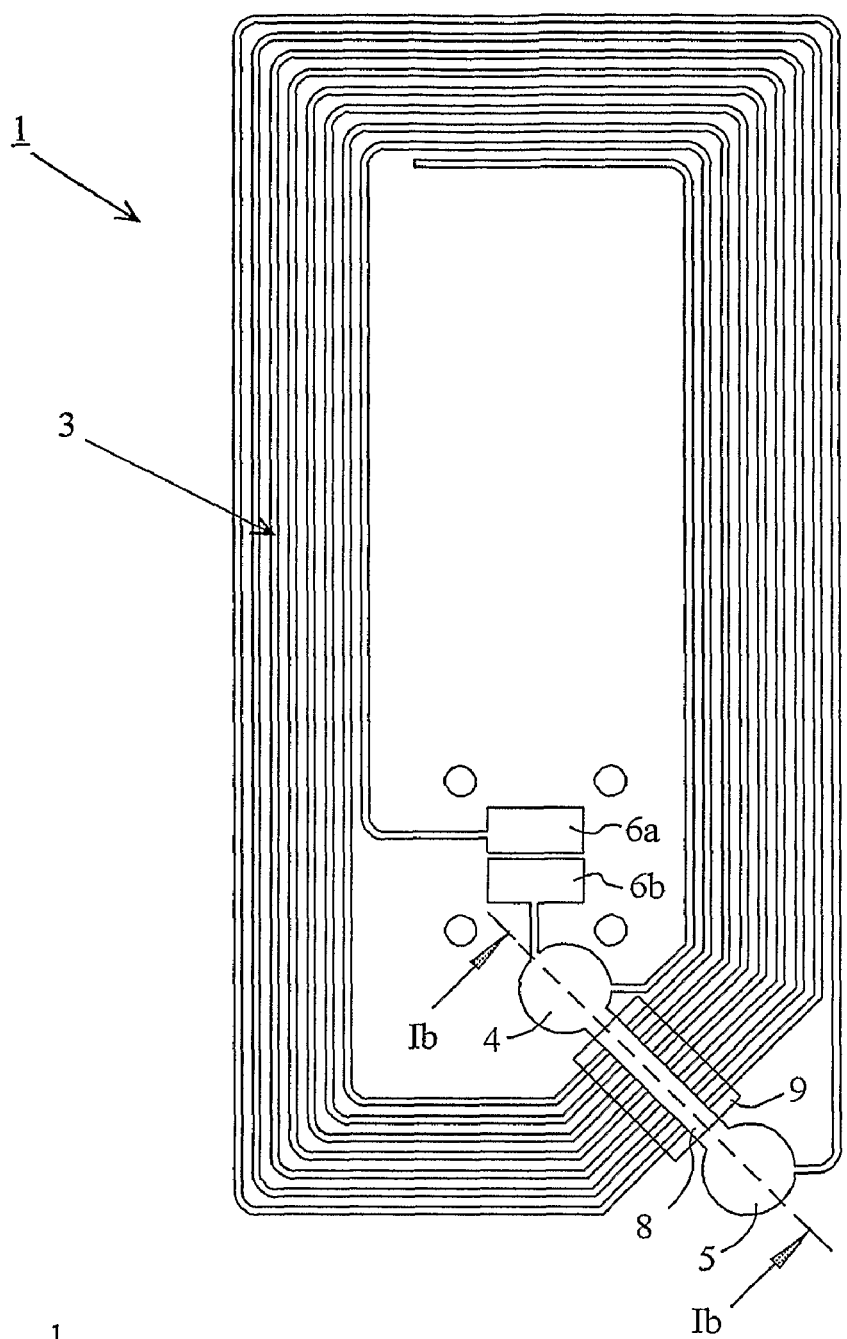
FIGS. 1a and 1b are a plan view and a cross-sectional view along the line 1b-1b in FIG. 1a, respectively, of an RFID label according to the prior art.
Figure 1B:
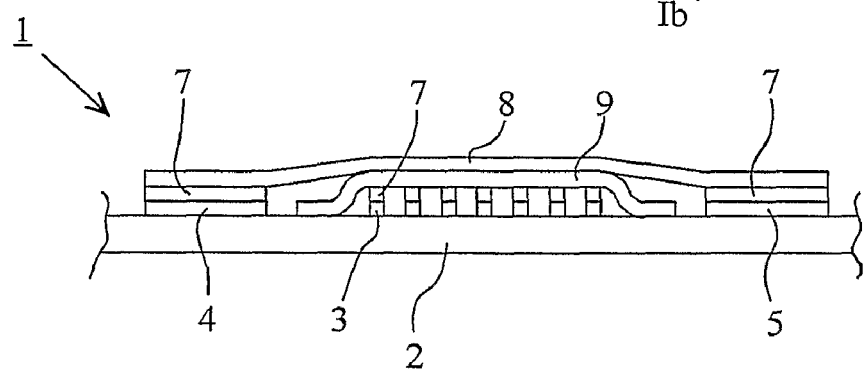

FIGS. 1a and 1b show a prior art RFID label produced by means of a prior art method. The RFID label 1 comprises a dielectric substrate 2 (not shown in FIG. 1a), to which a substantially rectangular (in this example) coil-shaped electrically conductive track 3 of, for example, an argentiferous ink has first been applied. The track 3 is provided with disc-shaped widened portions at or at least near the ends thereof, which widened portions are referred to as pads 4, 5. Near the pad 4 inside the coil shape, the track 3 also comprises two rectangular pads 6a, 6d for the eventual placement thereon of an IC (not shown) as well enough known to those skilled in the art.

The electrically conductive track 3, which has a very limited thickness and which has been applied to the substrate 2 by means of the so-called gravure printing method, has been thickened, for example through electrolysis, as a result of which an electrically conductive thickening layer 7, for example of copper, has been formed along the entire length of the track 3, so that the (joint) thickness of the electrically conductive track 3 and the thickening layer 7 (present thereon) suffices for having the coil-shaped part of the track 3 function as an antenna. To that end it is necessary, however, that an electrically closed circuit be formed, which is achieved by using an electrically conductive bridge 8 that extends above the coils of the coil-shaped part of the electrically conductive track 3. To prevent the bridge 8 from coming into electrically conductive contact with said coils, a dielectric bridge 9 forming a shield has been provided over the coils in question.

FIGS. 2a-3d relate to a method according to the invention by which an RFID label comparable to the label shown in FIGS. 1a and 1b can be produced in a simpler manner. As is the case with the RFID label 1, the starting point is a dielectric substrate 2 on which a coil-shaped, electrically conductive track 3 provided with pads 4, 5 at the ends thereof is present. In contrast to the situation that is shown in FIGS. 1a and 1b, the substrate 2 is provided with a second track 21 on the side of the substrate 2 remote from the track 3, which second track extends between the pads 4 and 5 (FIGS. 2a, 3a) when seen in plan view. FIGS. 2b and 3b show how two through holes 22, 23 are pierced in the substrate 2 at the location of (the centre of) the pads 4, 5 during a next phase, which holes logically extend through (the ends of) the second track 21 as well (FIGS. 2b, 3b).

Finally, the circuit of the electrically conductive track 3 is closed by interconnecting the pads 4, 5 via the second track 21, so that the presence of a dielectric bridge, such as the bridge 9 in FIGS. 1a and 1b, over the coils of the electrically conductive track 3 is not needed. To close the circuit in this way a connection must be effected via the through holes 22, 23 between the pads 4, 5 on the one hand and the second track 21 on the other hand.

An important advantage that is obtained on account of the aforesaid piercing of through holes 22, 23 by means of needles 24, 25 is that the material of the electrically conductive track 3 is smeared out to a certain extent over the walls of the through holes 22, 23. Said smearing out may take place to such an extent that an electrically conductive connection 26 (FIG. 4a) is already effected by said piercing alone. Said smearing out may also take place to a lesser extent, however, so that material of the electrically conductive track 3 partially extends into the through hole 22/23 (numeral 27 in FIG. 4b), to be true, but not to the extent that an electrically conductive connection between the tracks 3 and 21 is already obtained directly after said piercing.

In addition to that there is a possibility that hardly any smearing out will occur in the through hole 22, 23 upon piercing, if at all, as is shown in FIG. 4c. FIG. 4c might also apply in the situation in which the through hole 22, 23 is not obtained by piercing but by punching or drilling, for example, and although said operations do not provide the same advantages as the piercing operation, their use should not be excluded within the framework of the present invention. With regard to FIGS. 4a, 4b and 4c it is furthermore worth mentioning that plastic deformation of the substrate 2 occurs to a certain extent as a result of the forming of the through holes 22, 23 therein.

Returning now to FIGS. 2c and 3c, the substrate 2 which, as those skilled in the art will appreciate, may form part of a web of substrate material, is conveyed through an electrolytic bath, which bath will be explained in more detail yet with reference to FIG. 8. An anode 31 is provided in said electrolytic bath on the side of the substrate 2 on which also the second track 21 is present, whilst the first track has been contacted with cathodes 32 in the electrolytic bath. Said cathodes roll over the first track 3 during transport through the electrolytic bath. Furthermore, a second anode 33 is provided in the electrolytic bath on the side of the substrate 2 where the electrically conductive track 3 is present on the substrate 2.

Figure 2A:
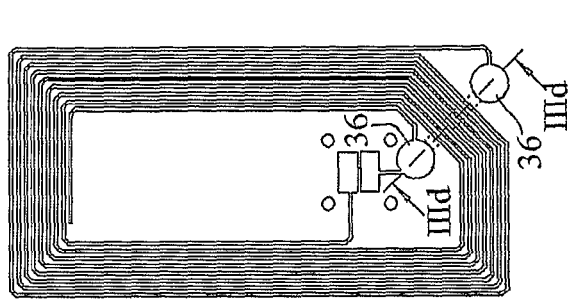
FIGS. 2a-2d are schematic plan views of four successive situations during the execution of a preferred embodiment of the method according to the invention for producing RFID labels comparable to the labels shown in FIGS. 1a and 1b.
Figure 2B:
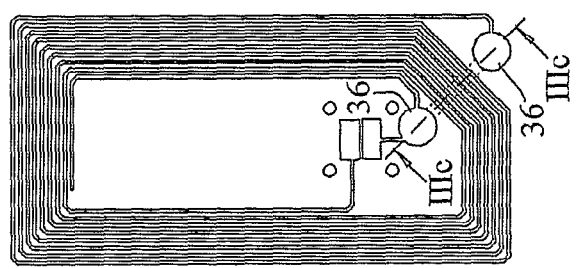
Figure 2C:
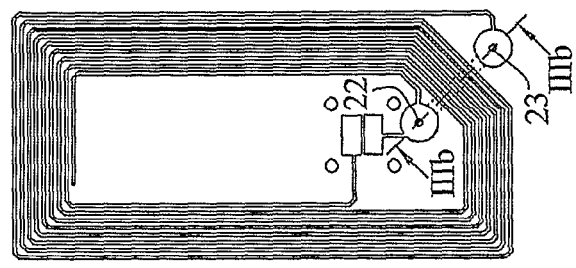
Figure 2D:
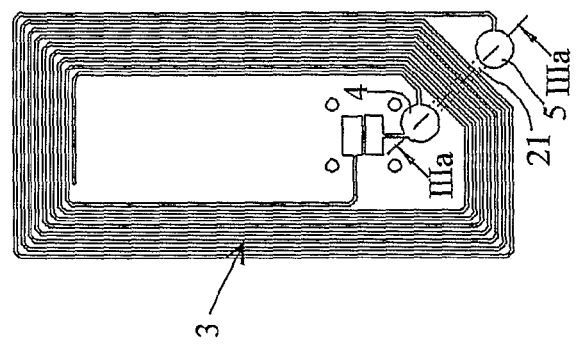
Figure 3A:
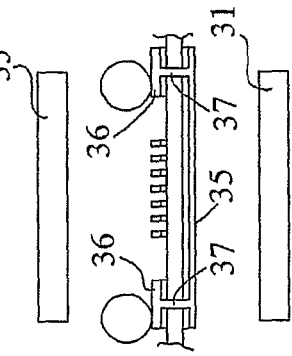
FIGS. 3a-3d are cross-sectional views along the lines IIIa-IIIa, IIIb-IIIb, IIIc-IIIC and IIId-IIID in FIGS. 2a-2d, respectively.
Figure 3B:
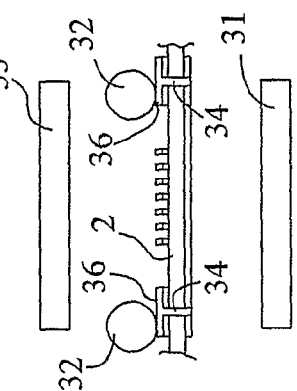
Figure 3C:
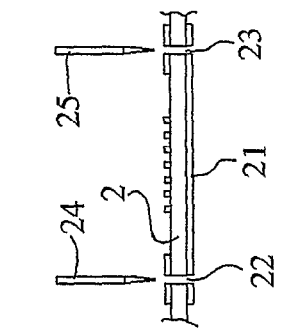
Figure 3D:
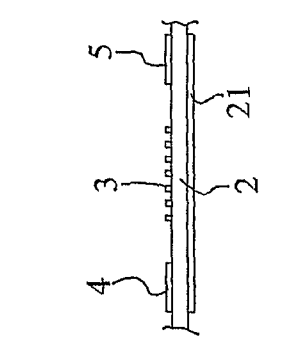

Partially on account of the dielectric nature of the substrate 2, the field lines between the anode 31 and the cathodes 32 will extend via the through holes 22, 23. Ions, for example copper ions, that are present in the electrolytic bath will migrate through the electrolytic bath along said field lines in the direction of one of the cathodes 32 and subsequently precipitate on the inner side of the through holes 22, 23 at the ends of the electrically conductive track 3. Thus, electrolytic growth will take place from the track 3, along the wall of the through holes 22, 23, in the direction of the second track 21. At some point this will result in an electrically conductive connection 34 being effected between the tracks 3 and 21 (FIGS. 2c, 3c). From that moment the track 21 is cathodically connected as well, and precipitation of copper ions will also take place on the electrically conductive track 21, as is indicated at 35 in FIGS. 3d and 5b.

Because of the presence of the anode 33, precipitation of ions, for example copper ions, that are present in the electrolytic bath on the electrically conductive track 3 will already take place at the same time that the electrically conductive connection 34 is made. Said electrolytic growth of the track 3 is indicated at 36 in FIGS. 2c, 3c, 3d, 5a and 5b. If an electrically conductive connection between the tracks 3 and 21 has not been directly effected upon piercing, as is shown in FIG. 4a, the electrolytic growth 35 on the track 21 will start later than the electrolytic growth 36 on the track 3, so that the electrolytic growth 36 will be thicker than the electrolytic growth 35. The electrically conductive connection 37 (initially 34) eventually results in the desired closed circuit being obtained upon placement of an IC on the pads 6a, 6b.

FIGS. 6a-6f show an alternative embodiment of a method according to the invention, which is in particular suitable for (mass) production of electrical components that comprise a dielectric substrate on which comparatively small electrically conductive patterns having main dimensions (length and width) in the order of about 20 mm are present. Precisely because of the limited dimensions of said conductive patterns, it is difficult if not impossible in practice to realise a thickness that suffices for the specific use of such patterns by electrolytic means. The starting point is a dielectric substrate 51 with electrically isolated, comparatively small electrically conductive patterns 52 on one side (the bottom side in FIGS. 6a-6f) and a connecting track 53 on the opposite side. FIG. 6c shows how the through hole 54 is pierced in the substrate 2 by means of needles 55 at the location of each track 52. The holes 54 are absolutely comparable to the holes 22, 23 in the preceding preferred embodiment.

FIGS. 6d and 6e show how an electrically conductive connection 56 is first effected between the connecting track 53 on the one hand and the mutually isolated, small electrically conductive tracks 52 on the other hand. To this end the substrate 51 is conveyed through an electrolytic bath in which an anode 57 (comparable to the anode 31) is provided on the side of the substrate 51 where also the tracks 52 are present and in which the connecting track 53 has been brought into electrically conductive contact with the cathode 58. The connection 56 will be effected in the manner as already described with reference to FIGS. 5a and 5b. After the connection has been effected via the through holes 54, ions from the anode 57 will precipitate on the individual tracks 52 in the form of the electrolytic precipitation 59 until the desired thickness is reached (FIG. 6e). Following said electrolytic growth 59 on the tracks 52, the substrate 51 is removed from the electrolytic bath, after which the track 53 is removed from the substrate 51 over the entire thickness thereof (FIG. 6f), for example by etching the track 53 away. In this way the individual tracks 52 with the electrolytic growth 59 present thereon are isolated from each other again. Alternatively it is also possible, for example, to make scratches in the track 53 so as to electrically isolate the tracks 52 with the growth 59 present thereon from each other, or to separate the individual tracks 52 from each other by dividing the substrate 51 into pieces, in which case one individual track 52 is provided for each piece.

Although there are several similarities with the preferred embodiments according to FIGS. 2a-3d, it is important to note that the preferred embodiment according to FIGS. 6a-6f, more specifically FIGS. 6d and 6e, does not make use of a second anode on the side of the connecting track 53, since electrolytic growth of said track 53 is neither necessary nor desirable, the more so because said track 53 will eventually be removed from the substrate 51 again. The only function that the track 53 performs is therefore the provision of an electrically conductive connection between the cathode 58 on the one hand and the individual tracks 52 on the other hand.

FIG. 7, in combination with FIG. 8, schematically shows a possible implementation of the method according to the invention during mass production. The starting point is a flexible web of substrate material 72, which is unwound from a roll 71. Both sides of said web have been provided with electrically conductive tracks during a previous phase, for example by means of the gravure printing method, which is known per se, which tracks are present on the substrate material 72 in a regular pattern. From said roll 71, the web and 72 is subsequently passed over the dancer roller 73, which can move up and down in the directions indicated by the double arrow 78, the guide roller 74, the driving roller 75 with the pressure roller 76, the dancer roller 77, which can move up and down in the directions indicated by the double arrow 79, and the guide roller 80.

At the bottom side of the web 72, in so far as it extends between the guide roller 74 and the driving roller 75, a press-on device 81 is provided, which comprises a horizontally oriented pressure surface 82 that extends perpendicularly to the plane of drawing under the web 72, amply covering the width thereof, as well as a vertical arm 83. In addition to that, the press-on device 81 comprises a second vertical arm 84, which is rigidly connected at its bottom side to a fixed structure 85, for example a frame of the press-on device 81. The arms 83 and 84 are pivotally interconnected via horizontal arms 90, 91 and pivots 86, 87, 88, 89, thus forming a four-rod mechanism consisting of the arms 83, 84, 90, 91 and the pivots 86, 87, 88, 89. The arms 83 and 84 continue to be oriented parallel to each other, i.e. vertically, upon joint pivoting about the pivots 86-89. Such pivoting will further result in the horizontal pressure surface 82 being moved up and down as indicated by the double arrow 92.

Figure 9:
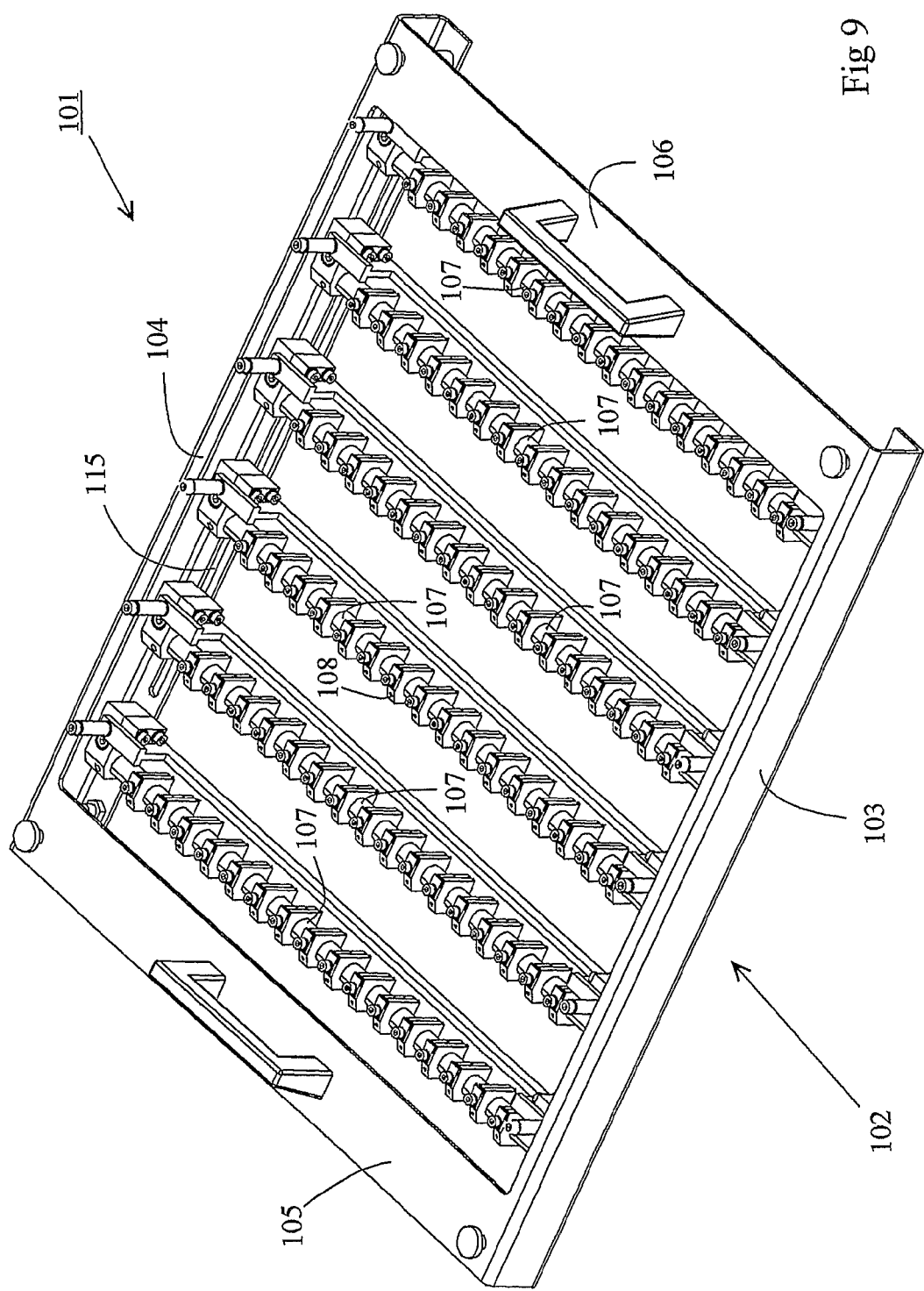
FIG. 9 is a perspective view of a needle holder that forms part of the device that is shown in FIG. 7.
Figure 10:
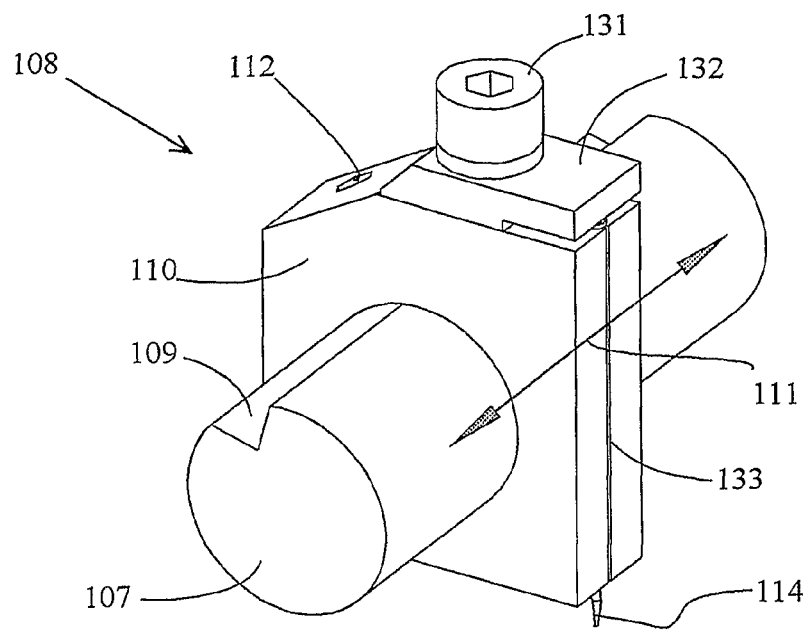
FIG. 10 is a perspective view of a needle unit that forms part of the needle holder of FIG. 9.

Present at the upper side of the web 72, insofar as it extends between the guide roller 74 and the driving roller 75, is a needle holder 101, which is shown in more detail in FIG. 9. The needle holder 101 comprises a substantially rectangular framework 102 with longitudinal girders 103, 104, which extend parallel to the direction of transport of the web 72, and cross girders 105, 106. Six sliding shafts 107 extend between the longitudinal girders 103, 104. In the present example, sixteen needle units 108, which will be discussed in more detail hereinafter with reference to FIG. 10, can be moved along each sliding shaft 107.

A longitudinal groove 109 having a square apex angle has been formed in the longitudinal shaft 107. Each needle unit 108 comprises a base member 110 provided with a central bore that enables movement of the base member 110 and thus of the needle unit 108 as a whole along the sliding shaft 107 in the directions indicated by the double arrow 111. To fix the base member 110 in place at a specific longitudinal position on the sliding shaft 107, the needle unit 108 comprises an adjusting screw 112, whose right-angled point 113 (also refer to FIG. 11a) can be rotated to a position within the central bore in the base member 110, such that said right-angled point 113 extends into the longitudinal groove 109. In this way not only the longitudinal position is fixed, but also the angular position of the needle unit 108 with respect to the sliding shaft 107. Each needle unit 108 is furthermore provided with a needle 114, which is directed at the web 72, being oriented at right angles thereto. The needle 114 is received along the larger part of its length in the circular part of a keyhole-shaped recess that has been formed in the base member 110 by means of spark erosion. In those cases in which it must be possible to provide a number of needles 114 for each needle unit, it will also be possible, of course, to use a multiple keyhole shape. Numeral 133 relates to the entering and exiting spark erosion seam. At its upper side, the needle 114 is provided with a head 134, whose diameter is larger than that of the circular part of the keyhole-shaped recess. The needle is pressed down from above via the head 134 by means of the pressure plate 132, which is screwed down on the base member 110 by means of the nut 131.

In addition to moving the needle units 108 along the sliding shafts 107, it is also possible to move the sliding shafts 107 and the associated needle units 108 along the longitudinal girders 103, 104, to which end said longitudinal girders are provided with longitudinal guides, of which longitudinal guides only the longitudinal guide 115 for the longitudinal girder 104 is shown in FIG. 9. Thus it is possible to arrange the needles 114 that form part of the needle holder 101 at desired interspaces with respect to each other both in longitudinal direction and in transverse direction within the framework 102, as a result of which the respective needle positions can be geared to the pattern of tracks on the web 72.

Figures 11A, 11B:
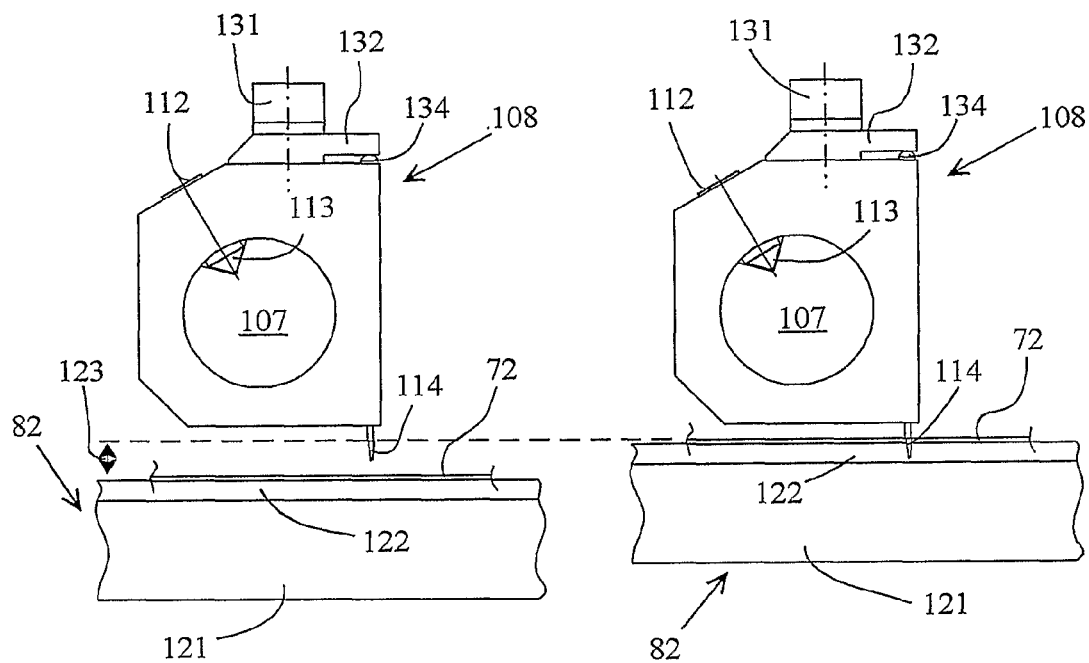
FIGS. 11a and 11b are vertical sectional views of the needle unit of FIG. 10 during operation thereof.

FIGS. 11a and 11b show, for a single needle unit 108, the manner in which the piercing of through holes by means of the press-on device 81 and the needle holder 101 takes place. Said figures show the web 72, which bears on the upper side of the pressure surface 82. Said pressure surface 82 comprises two layers, viz. a hard base layer 121 and a soft top layer 122, which may be made of rubber, cardboard or a sponge-like material, for example. To form the through holes, the pressure surface 82 is moved over a distance 123 from the position that is shown in FIG. 11a in the direction of the needle holder 101 by pivoting the arm 90 and thus also the arm 91 upwards about the respective pivots 87, 89 with the aid of driving means (not shown). The web 72 is thus spiked by the needles 114, as it were, with the bottom side of the needle 114 extending into the top layer 122, so that it can be ensured that the holes being formed in the web 72 are actually through holes (FIG. 11b). Subsequently the pressure surface 82 is moved down to the original position (FIG. 11a) again by driving the arm 90 in reverse direction.

To ensure that the holes are made at the correct positions in the web 72, or more specifically in the conductive tracks thereon, sensors 99 are disposed just upstream of the needle holder 101, which sensors are capable of detecting a characteristic part of the tracks, for example a side edge thereof. This information is passed on to a control system (not shown), which ensures that the needle holder 101 is correctly aligned with the tracks in the direction perpendicular to the plane of drawing, and possibly also in the direction of transport or in the opposite direction, before the pressure surface 82 is moved upwards.

Said upward and downward movement of the pressure surface 82 and thus the formation of through holes in the web 72 takes place during the temporary period that the web 72 is not driven by the driving roller 75. The roll 71, on the other hand, continues to be unwound. The additional web length that is thus formed upstream of the guide roller 74 is offset in that the dancer roller 73 moves downwards. On the other hand, the discharge of the web 72 downstream of the driving roller 75 is not interrupted either, causing the dancer roller 77 to move upwards temporarily. Once the pressure surface 82 has returned to its original position and new through holes have thus been formed, the driving roller 75 is temporarily activated again to transport the web 72 further between the press-on device 81 along a length that corresponds to once, twice, three times or six times the distance between two successive sliding shafts 107, partially depending on the number of through holes that are to be formed in the web 72. At those moments the dancer rollers 73 and 77 return to their original positions again.

Within the context of the foregoing it is furthermore noted that it is very well possible within the framework of the invention to realise an electrically conductive connection between two electrically conductive tracks present on either side of the substrate 72 via pads, such as the pads 4, 5 in FIG. 1a, by forming a number of through holes, for example two or three through holes, rather than one hole for each pad. To that end a single needle unit 108 may be provided with two or three closely spaced parallel needles 114. The advantage of using a number of through holes for each pad is that the diameter of the through holes can thus remain limited, so that the field lines will extend in a very concentrated manner through the through holes upon subsequent electrolysis, as a result of which an accelerated electrolytic growth will take place in the through holes. Two needle units 108 may be used for forming holes in different pads that are arranged relatively close together, such as the pads 6b and 4 in FIG. 1a, for example. It will not be possible to mount such needle units 108 on a single shaft 107, but it will be necessary to place them on two different, for example successive, shafts 107, so that the respective holes in the pads 6b and 4 for a single pattern can be formed with two successive strokes of the press-on mechanism 81, between which strokes the substrate with the pattern present thereon is moved forward one stroke length.

FIG. 8, to conclude, is a schematic view of an electrolysis device 131 to which a web 72 can be supplied directly after having passed the device that is shown in FIG. 7 or after interim winding of the web 72 with through holes formed therein. The electrolysis device 131 comprises a container 132 in which an electrolytic saline solution 133 is present, a drum 134 that is rotatable about its central axis and an anode 31, 57 disposed in said electrolytic saline solution 133, with regard to which reference is made to FIGS. 3c and 3d and FIGS. 6d and 6e again. Especially if the electrolysis device 131 is intended for producing RFIDs, it may be configured similarly to the device that has been described with reference to FIGS. 1-7 in US patent application US 2005/0189226 A1, which is to be considered incorporated herein by reference. The only point in which the device according to FIG. 8 would differ from the device as described in the aforesaid US patent application in that case is the presence of the anode 31, 157 in the electrolytic saline solution 133.

In case the electrolysis device 131 is used for carrying out the method according to FIGS. 6a-6f, it is also possible, however, to use an electrolysis device 131 of simpler design, for example an electrolysis device which is not provided with a (second) anode on the inner side of the outer circumference of the drum and in which the cathode is disposed outside the saline solution 133, with pressure rollers 135 functioning as cathodes, for example. The first track 53 in FIGS. 6a-6e may in that case be configured as tracks which extend parallel to each other in the longitudinal direction of the web 72 and which are spaced the same distance apart as the tracks 52, seen in transverse direction.

the invention claimed is:

1. A method for making an electrically conductive connection between two electrically conductive tracks present on two opposite sides of a dielectric substrate, comprising:
providing the substrate, with at least one first track present on one side thereof and at least one second track present on the other side of the substrate opposite said one side, the first and second tracks being electrically conductive tracks;
forming a through hole through the substrate and through the first track and the second track; and
making an electrically conductive connection via said through hole between the first track through which the through hole has been formed and the second track through which the through hole has been formed,
wherein the electrically conductive connection extends along a wall of the through hole,
the providing step includes unwinding the substrate from a roll,
the making step includes conveying the unwound part of the substrate through an electrolytic bath, and
the forming step includes forming the through hole in the substrate at a position between the roll and the electrolytic bath.

2. The method according to claim 1, wherein the through hole is formed by piercing, using a piercing tool.

3. The method according to claim 2, wherein the electrically conductive connection is obtained by the piercing of the through hole.

4. The method according to claim 1, wherein the making step includes electrolytically growing an electrically conductive material from the first track, via the through hole, to the second track in the electrolytic bath.

5. The method according to claim 4, wherein an anode is provided on the side of the substrate remote from the first track and the first track is brought into electrical contact with a cathode.

6. The method according to claim 5, wherein a further anode is provided on the side of the substrate on which the first track is present.

7. The method according to claim 5, wherein an anode is provided only on the side of the dielectric substrate remote from the first track.

8. The method according to claim 5, wherein the cathode makes contact with the first track in the electrolytic bath.

9. The method according to claim 8, wherein the cathode rolls over the first track.

10. The method according to claim 4, further comprising:
electrolytically increasing the thickness of the second track during the electrolytically growing, after the making.

11. The method according to claim 10, further comprising:
removing the first track at least partially from the substrate, after the electrolytically growing.

12. The method according to claim 1, further comprising:
locally interrupting transport of the unwound part of the substrate temporarily while the through hole is being formed in the substrate.

13. The method according to claim 1,
wherein the providing step includes providing the substrate with at least two second tracks, which are electrically isolated from each other,
the forming step includes forming two through holes in the substrate through two opposite parts of one and a same first track and of two second tracks, respectively, and
the making step includes making two electrically conductive connections, via the two through holes, between the first track, through which the two through holes have been formed, and the two second tracks, through which the respective two through holes have been formed.

14. The method according to claim 13, wherein main dimensions of the second tracks are smaller than 35 mm.

15. The method according to claim 1,
wherein the forming step includes forming a number of through holes in the substrate through two opposite parts of one and a same first track and of one and a same second track, respectively, and
the making step includes making electrically conductive connections, via the two through holes, between the first track, through which the two through holes have been formed, and the second track, through which the through holes have been formed.

16. The method according to claim 1, wherein the through hole is oriented perpendicularly to the plane of the substrate.

17. The method according to claim 1, wherein the through hole further extends within the circumference of at least one of the first track and the second track.

18. The method according to claim 1, wherein the proportion between a diameter of the through hole, measured in two different directions perpendicular to a central axis of the through hole, is maximally 2.

19. The method according to claim 1, wherein the through hole has a circular cross-section.

20. The method according to claim 1, wherein the through hole is formed by a pin-shaped element.

21. A method for making an electrically conductive connection between two electrically conductive tracks present on two opposite sides of a dielectric substrate, comprising:
  providing the substrate, with at least one first track present on one side thereof and at least one second track present on the other side of the substrate opposite said one side, the first and second tracks being electrically conductive tracks;
  forming a through hole through the substrate and through the first track and the second track; and
  making an electrically conductive connection via said through hole between the first track through which the through hole has been formed and the second track through which the through hole has been formed,
  wherein the making includes electrolytically growing an electrically conductive material from the first track, via the through hole, to the second track in an electrolytic bath.

22. A method for making an electrically conductive connection between two electrically conductive tracks present on two opposite sides of a dielectric substrate, comprising:
  providing the substrate, with at least one first track present on one side thereof and at least one second track present on the other side of the substrate opposite said one side, the first and second tracks being electrically conductive tracks;
  forming a through hole through the substrate and through the first track and the second track; and
  making an electrically conductive connection via said through hole between the first track through which the through hole has been formed and the second track through which the through hole has been formed,
  wherein the electrically conductive connection extends along a wall of the through hole,
  the providing step includes providing the substrate with at least two second tracks, which are electrically isolated from each other,
  the forming step includes forming two through holes in the substrate through two opposite parts of one and a same first track and of two second tracks, respectively, and
  the making step includes making two electrically conductive connections, via the two through holes, between the first track, through which the two through holes have been formed, and the two second tracks, through which the respective two through holes have been formed.

23. The method according to claim 22, wherein main dimensions of the second tracks are smaller than 35 mm.

* * * * *